(12) United States Patent
Delshadpour et al.

(10) Patent No.: US 12,028,071 B2
(45) Date of Patent: Jul. 2, 2024

(54) HIGH-SPEED WIDE-BAND LOW-POWER LEVEL SHIFTER FOR HIGH-SPEED APPLICATIONS

(71) Applicant: NXP USA, Inc., Austin, TX (US)

(72) Inventors: Siamak Delshadpour, Phoenix, AZ (US); Xueyang Geng, Chandler, AZ (US); David Edward Bien, Glendale, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/983,300

(22) Filed: Nov. 8, 2022

(65) Prior Publication Data

US 2024/0154608 A1  May 9, 2024

(51) Int. Cl.
*H03K 19/0175* (2006.01)
*H03K 3/356* (2006.01)
*H04L 25/03* (2006.01)

(52) U.S. Cl.
CPC ..... *H03K 3/356* (2013.01); *H03K 19/017509* (2013.01); *H03K 19/017518* (2013.01); *H04L 25/03878* (2013.01)

(58) Field of Classification Search
CPC ............... H03K 3/356; H03K 19/0175; H03K 19/017509; H03K 19/018; H03K 19/01806; H03K 19/01812; H03K 19/0185; H03K 19/018507; H03K 19/018514
See application file for complete search history.

(56) References Cited

U.S. PATENT DOCUMENTS

| | | | |
|---|---|---|---|
| 7,400,196 B2 | 7/2008 | Wyatt | |
| 10,447,507 B1 | 10/2019 | Zhang et al. | |
| 10,917,055 B2 | 2/2021 | Geng et al. | |
| 11,245,555 B1* | 2/2022 | Delshadpour | ......... H03F 3/4552 |
| 11,349,463 B2 | 5/2022 | Delshadpour et al. | |
| 2020/0153395 A1 | 5/2020 | Geng et al. | |
| 2022/0140821 A1* | 5/2022 | Delshadpour | .......... H03K 5/003 327/333 |

OTHER PUBLICATIONS

Gondi, Srikanth et al. "Equalization and Clock and Data Recovery Techniques for 10-GB/s CMOS Serial-Link Receivers", IEEE Journal of Solid-State Circuits, vol. 42, No. 9, Sep. 2007, pp. 1999-2011.
"Universal Serial Bus 3.2 Specifications", Revision 1.0, Sep. 22, 2017, Available: http://www.usb.org, 548 pgs.

* cited by examiner

*Primary Examiner* — Long Nguyen

(57) ABSTRACT

Embodiments of level shifters are disclosed. In an embodiment, a level shifter includes a transistor connected between an input terminal of the level shifter and an output terminal of the level shifter, a first resistor connected between a first terminal of the transistor and one of the input terminal of the level shifter and the output terminal of the level shifter, a capacitor connected between the input terminal of the level shifter and the output terminal of the level shifter, a current source connected between the output terminal of the level shifter and a fixed voltage, and a resistor divider connected between the first resistor and the output terminal of the level shifter.

20 Claims, 7 Drawing Sheets

HIGH-SPEED WIDE-BAND LOW-POWER LEVEL SHIFTER FOR HIGH-SPEED APPLICATIONS

BACKGROUND

Wide band communication systems such as universal serial bus (USB), high-definition multimedia interface (HDMI), DisplayPort (DP), Peripheral Component Interconnect Express (PCIe), Thunderbolt, Converged Input Output (CIO, also known as USB4) and other high-speed communication applications often include stages of processing within their electronic circuitry. A wideband communications system can include several stages including modules to equalize, amplify, and/or re-drive signals for its data channels. Usually, one stage cannot provide enough gain or equalization. In such multi-stage systems, the use of intermediate level shifters (which can also act as a buffer stage) between each stage may be advantageous. For example, level shifters may be used between an input stage and internal stages as a Continuous Time Linear Equalizer (CTLE), or between an internal stage and an output stage to avoid loading out the output stage on any internal stage to have better process, voltage, temperature (PVT) control on high-speed performance. A level shifter can also function as an interface between an input pin, which typically shows an input termination (e.g. 50 ohm (Ω)), and a CTLE.

Oftentimes, however, a level shifter may consume even more power than an equalizer, an amplifier, and/or a driver, which makes a level shifter design more critical in a wide band communication system, especially for use in a low voltage (e.g., around 1.8V or lower) system. Therefore, there is a need for level shifters in wide bandwidth communication systems with low power consumption and high efficiency.

SUMMARY

Embodiments of level shifters are disclosed. In an embodiment, a level shifter includes a transistor connected between an input terminal of the level shifter and an output terminal of the level shifter, a first resistor connected between a first terminal of the transistor and one of the input terminal of the level shifter and the output terminal of the level shifter, a capacitor connected between the input terminal of the level shifter and the output terminal of the level shifter, a current source connected between the output terminal of the level shifter and a fixed voltage, and a resistor divider connected between the first resistor and the output terminal of the level shifter. The transistor and the first resistor can be used to form a first signal path for a low-frequency component of an input signal received at the input terminal of the level shifter, while the capacitor can be used to form a second signal path for a high-frequency component of the input signal received at the input terminal of the level shifter to reduce power consumption and to improve efficiency. Other embodiments are also described.

In an embodiment, the transistor and the first resistor are located in a first signal path for a low-frequency component of an input signal received at the input terminal of the level shifter, and the capacitor is located in a second signal path for a high-frequency component of the input signal received at the input terminal of the level shifter.

In an embodiment, the resistor divider includes resistors and switches connected to the resistors.

In an embodiment, the transistor includes a source follower or an emitter follower.

In an embodiment, the level shifter is a single-ended level shifter.

In an embodiment, the level shifter is a differential level shifter.

In an embodiment, a level shifter includes a transistor connected between an input terminal of the level shifter and an output terminal of the level shifter, a first resistor connected between a first terminal of the transistor and the output terminal of the level shifter, a capacitor connected between a second terminal of the transistor and the output terminal of the level shifter, where the capacitor is connected to the input terminal of the level shifter, a current source connected between the first resistor and ground, and a resistor divider connected between the first resistor and the output terminal of the level shifter, where the transistor and the first resistor are located in a first signal path for a low-frequency component of an input signal received at the input terminal of the level shifter, and where the capacitor is located in a second signal path for a high-frequency component of the input signal received at the input terminal of the level shifter.

In an embodiment, the resistor divider includes resistors and switches connected to the resistors and ground.

In an embodiment, the transistor comprises a bipolar junction transistor (BJT), the first terminal of the transistor includes an emitter terminal of the BJT, and the second terminal of the transistor includes a base terminal of the BJT.

In an embodiment, a collector terminal of the BJT is connected to a supply voltage through a second resistor.

In an embodiment, the capacitor is connected to the first resistor through a second resistor and to the output terminal of the level shifter through a third resistor.

In an embodiment, the current source is connected to the first resistor and to the second resistor.

In an embodiment, the level shifter further includes a second transistor connected to the current source and to the resistor divider through a second resistor.

In an embodiment, the capacitor is connected to the output terminal of the level shifter through a third resistor and to the first terminal of the transistor through a fourth resistor.

In an embodiment, the current source is connected to the second resistor and the capacitor through a fifth resistor.

In an embodiment, the level shifter further includes a second resistor connected to the input terminal of the level shifter and a switch connected to the second resistor and to a supply voltage.

In an embodiment, the level shifter is a single-ended level shifter.

In an embodiment, a differential level shifter includes a first transistor connected between a first input terminal of the differential level shifter and a first output terminal of the differential level shifter, a first resistor connected between a first terminal of the first transistor and the first output terminal of the differential level shifter, a first capacitor connected between a second terminal of the first transistor and the first output terminal of the differential level shifter, where the first capacitor is connected to the first input terminal of the differential level shifter, a first current source connected between the first resistor and ground, a second transistor connected between a second input terminal of the differential level shifter and a second output terminal of the differential level shifter, a second resistor connected between a first terminal of the second transistor and the second output terminal of the differential level shifter, a second capacitor connected between a second terminal of the second transistor and the second output terminal of the differential level shifter, where the second capacitor is connected to the second input terminal of the differential level shifter, a second current source connected between the second resistor and ground, and a resistor divider connected between the first resistor and the second resistor.

In an embodiment, the resistor divider includes resistors and switches connected to the resistors and ground.

In an embodiment, the first transistor includes BJT, the first terminal of the first transistor includes an emitter terminal of the BJT, and the second terminal of the first transistor includes a base terminal of the BJT.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
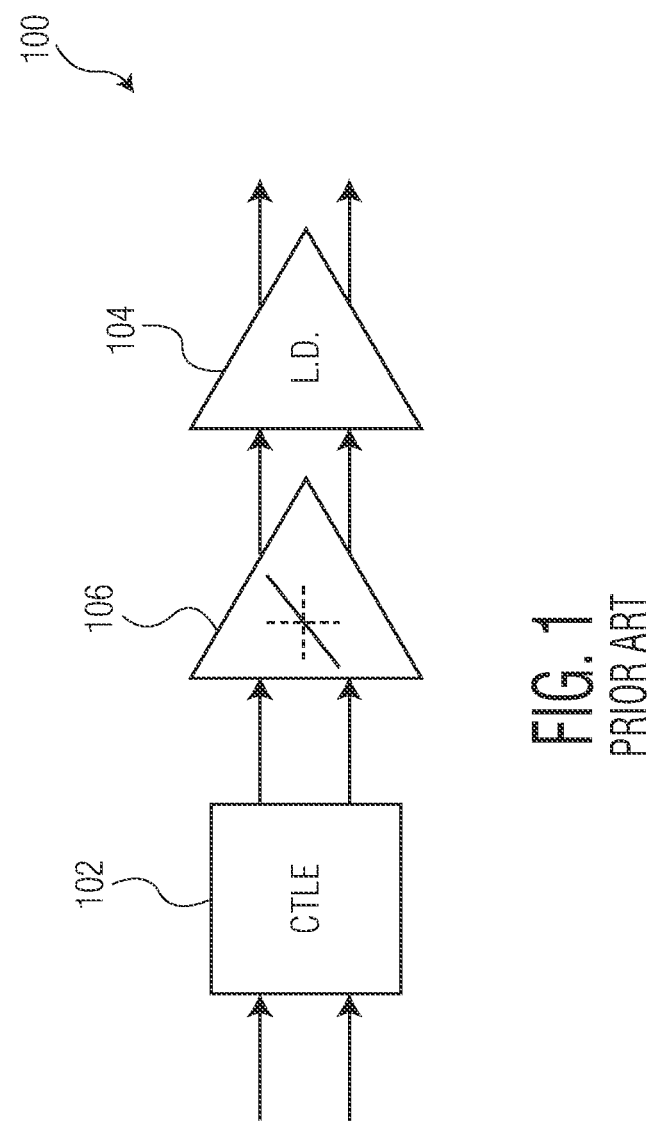
FIG. 1 illustrates a typical architecture of a linear redriver.

FIG. 1 illustrates a typical architecture of a linear redriver 100. The linear redriver 100 includes a continuous-time linear equalizer (CTLE) 102 to equalize input signals and a linear transmitter (TX) line driver 104 to transmit or retransmit the signals based on signal standard specifications. Due to gain variation over process, voltage and temperature (PVT) and significant parasitic loadings from a corresponding transmitter (not shown in FIG. 1), a gain stage 106 may be needed between the CTLE 102 and the TX line driver 104. The gain stage 106 can be a programmable gain amplifier (PGA) or an automatic gain control (AGC) stage. Depending on the design, the programmable gain stage can stay or be eliminated.

Figure 2:
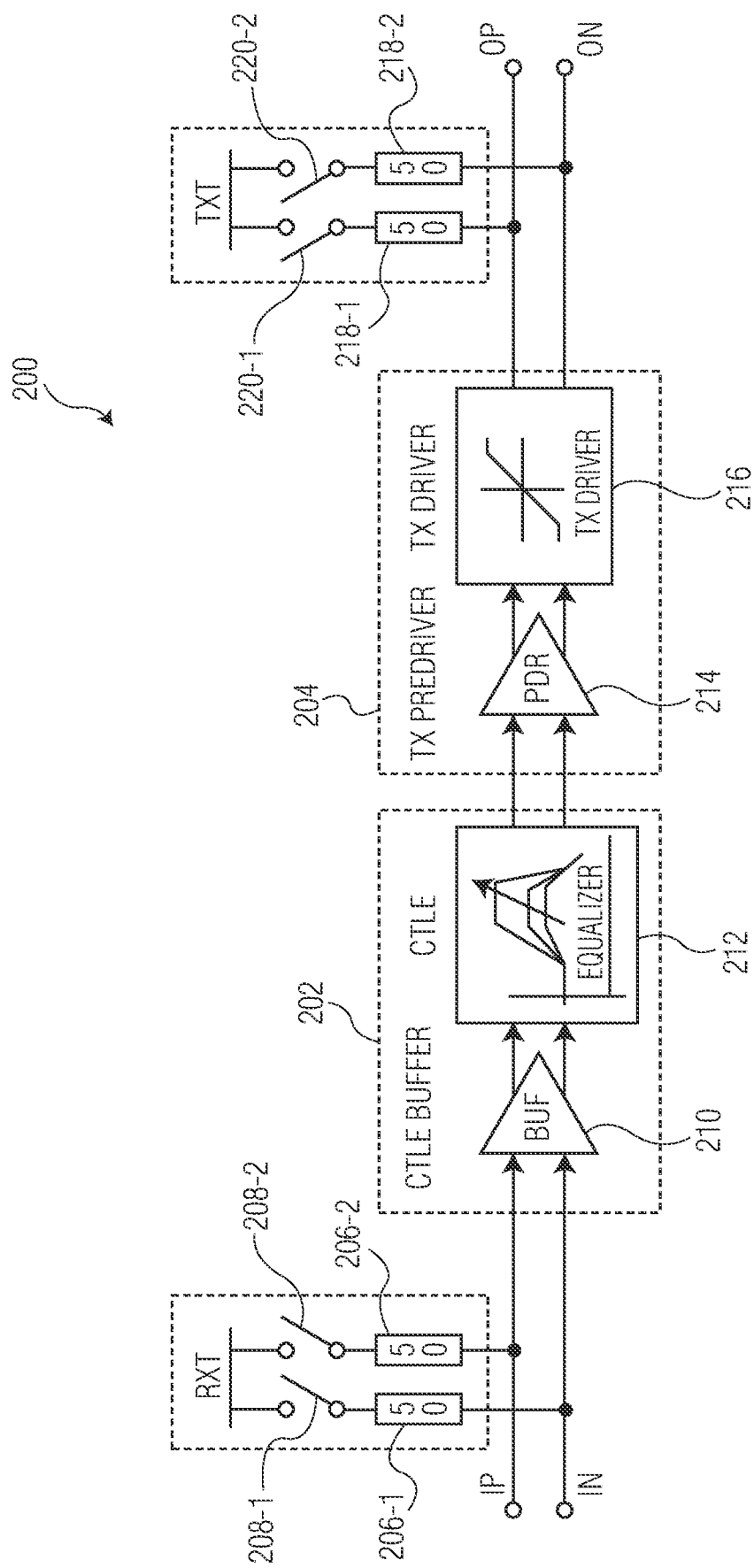
FIG. 2 illustrates a wideband communication circuit in the form of a linear redriver without a gain stage in which embodiments of the invention may be implemented.

Turning now to FIG. 2, a wideband communication circuit in the form of a linear redriver 200 without a gain stage in which embodiments of the invention may be implemented is illustrated. In some embodiments, a gain stage may be included in the linear redriver 200 depending on the architecture, design, and system requirement. In some embodiments, the linear redriver 200 is included in a wired circuit. In some embodiments, the linear redriver 200 is included in a wireless circuit.

As shown in FIG. 2, the linear redriver 200, which can be used in, for example, USB/HDMI/DP/Thunderbolt/PCIe/CIO data communication paths, includes an equalization block 202 that receives input signals at input terminals, IP, and, IN, and a transmission block 204 that outputs signals at output terminals, OP, and ON. The equalization block 202 includes a CTLE 212, while the transmission block 204 includes a TX driver 216. The TX driver 216 operates to drive a termination load disposed at a TX driver output. Output from the TX driver 216 typically drives 50Ω load terminations 218-1, 218-2 at its outputs, which are each connected to a respective switch 220-1 or 220-2. The 50Ω load terminations 218-1, 218-2 and the associated switches 220-1, 220-2 are shown as a Transmit Termination (TXT) within the dashed box positioned after the transmission block 204. Similar 50Ω loads 206-1, 206-2 can also be found to affect the inputs of the equalization block 202, which are also each connected to a respective switch 208-1 or 208-2. The 50Ω termination resistors 206-1, 206-2 and the associated switches 208-1, 208-2 are shown as a Receive Termination (RXT) within the dashed box positioned before the equalization block 202. The shown input and output termination are terminated to supply, but depending on the design, they can be terminated to ground or any DC voltage. A CTLE buffer (BUF) or level shifter 210, which may be implemented in accordance with an embodiment of the invention, can be disposed inline before the CTLE 212 to isolate the CTLE from the input pins and set a certain direct current (DC) level for the CTLE input. A TX pre-driver buffer (PDR) or level shifter 214, which may be implemented in accordance with an embodiment of the invention, can be disposed inline after the CTLE 212 and before the TX driver 216. A level shifter circuit described herein in accordance with embodiments of the invention may be used as the CTLE buffer or level shifter 210 and/or the TX pre-driver buffer or level shifter 214.

The TX driver 216 can be provided as a simple differential pair to drive what is typically a 50Ω termination (see FIG. 2, 500 load terminations 218-1, 218-2 or 50Ω load of the next stage). But this can call for the differential pair transistors to be relatively large devices. Furthermore, parasitic capacitors of the TX driver 216 and routing may load the CTLE 212 and impact its performance. As a result, the TX pre-driver buffer or level shifter 214 may be needed to isolate the CTLE 212 from the TX driver 216 and drive the long routing path from the CTLE to the TX driver. The TX pre-driver buffer or level shifter 214 may also provide the right or desired DC level for the TX driver inputs.

The linear redriver 200 is illustrated in FIG. 2 using 50Ω terminations 206-1, 206-2 to supply as the input terminations. Thus, any circuit required for the linear redriver 200 needs to work with higher DC level. In the case of termination to ground, the circuit needs to work with lower DC levels. The CTLE buffer or level shifter 210 can adjust the DC level for the CTLE input to avoid using high DC level for the CTLE input. Similarly, the TX pre-driver buffer or level shifter 214 can make a DC level adjustment for the TX driver 216 if needed.

Figure 3:
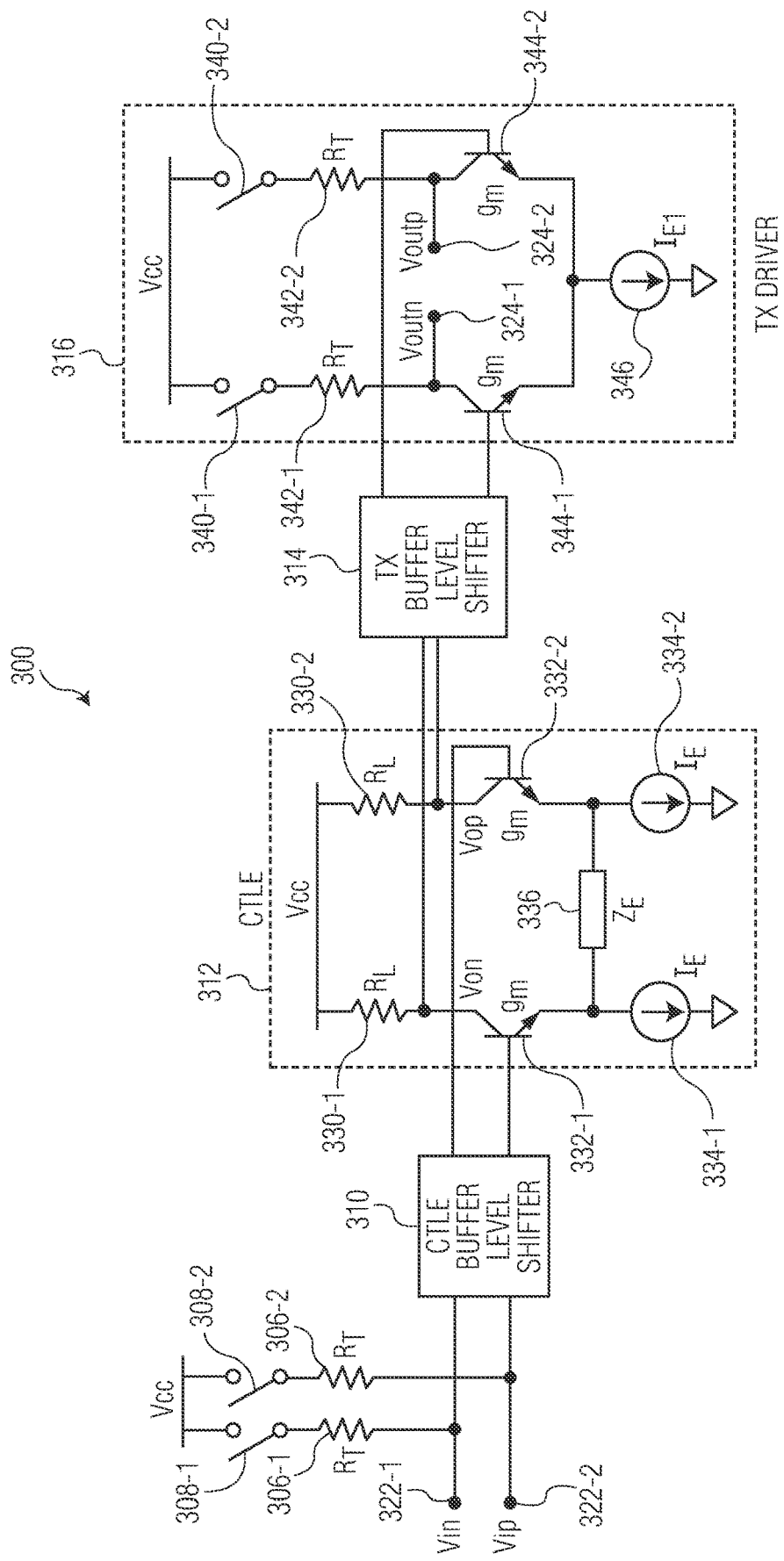
FIG. 3 shows an input/output stage of a wideband communication circuit in which embodiments of the invention can be implemented.

Turning now to FIG. 3, an input/output stage 300 of a wideband communication circuit, such as a redriver, in which embodiments of the invention can be implemented is shown. The input/output stage 300 includes a CTLE buffer level shifter 310 disposed between input pins/terminals 322-1, 322-2 through which input voltages, $V_{IN}$, $V_{IP}$, are received, and a communication component circuit, e.g., a CTLE 312. Termination resistors 306-1 and 306-2, for example, with a resistance value of $R_T$=50Ω termination, are connected to the input pins/terminals 322-1, 322-2 and to a supply voltage, $V_{CC}$, via switches 308-1 and 308-2. The termination resistors 306-1 and 306-2 can be connected the ground (or any other DC voltage) depending on the design strategy and employed technology. The CTLE buffer level shifter 310 isolates the CTLE 312 from the input pins 322-1, 322-2, which means that the CTLE buffer level shifter 310 needs to be high bandwidth and be able to shift DC voltage of signals to desire value for the CTLE 312. The CTLE buffer level shifter 310 may include input terminals that are connected to the input pins 322-1, 322-2, and output terminals that are connected to input terminals of the CTLE 312. In some embodiments, the input/output stage 300 is included in a wired circuit. In some embodiments, the input/output stage 300 is included in a wireless circuit.

In the embodiment depicted in FIG. 3, the CTLE 312 includes a pair of bipolar transistors 332-1 and 332-2 connected to the supply voltage, $V_{CC}$, via resistors 330-1 and 330-2 with a resistance value of $R_L$. The transistors 332-1 and 332-2 are also connected to a fixed voltage, e.g., ground, via current sources 334-1 and 334-2, each of which provides current, $I_E$. The bases of the transistors 332-1 and 332-2 are connected to the CTLE buffer level shifter 310, to receive output signals from the CTLE buffer level shifter 310. Each of the transistors 332-1 and 332-2 may have a transconductance of $g_m$. The CTLE 306 further includes an impedance element 336 connect to the emitters of the transistors 332-1 and 332-2. The impedance element 336 may include a resistor and a capacitor connected in parallel. The CTLE 312 may be a conventional CTLE with Rg/Cg degeneration impedance that can provide different CTLE peaking gain by programming or changing Rg. However, in other embodiments, the CTLE 312 may have a different architecture, for example, a two-dimensional CTLE architecture or conventional CTLE with different type of termination, for example inductive termination in series with $R_L$.

The input/output stage 300 also includes a TX buffer level shifter 314 disposed between the CTLE 312 and a TX driver 316. The TX buffer level shifter 314 isolates the TX driver 316 from the CTLE 312, which means that the CTLE buffer level shifter 310 needs to be high bandwidth and be able to shift DC voltage of signals to desire value for the CTLE 312. In the embodiment depicted in FIG. 3, the TX driver 316 includes a pair of bipolar transistors 344-1 and 344-2 connected to the supply voltage, $V_{CC}$, via resistors 342-1 and 342-2 with a resistance value of $R_T$, and switches 340-1, 340-2. The emitters of transistors 344-1 and 344-2 are also connected to a current source 346, which provides current, $I_{E1}$. The bases of the transistors 344-1 and 344-2 are connected to the TX buffer/level shifter 314, to receive output signals from the TX buffer level shifter 314. Each of the transistors 344-1 and 344-2 may have a transconductance of $g_m$ (different from g m of CTLE). Output voltages, $V_{OUTP}$ and $V_{OUTN}$, are outputted from output terminals/pins 324-1, 324-2. The TX driver 316 may be a traditional CML TX driver. However, any other TX driver can also be used. The TX driver 316 may need to drive 50Ω termination or 50Ω line, equally, a few tens of milli-ampere depending on the required swing and linearity, which makes the differential pair transistors 344-1, 344-2 relatively large devices. Parasitic capacitors of the TX driver 316 and routing can load the CTLE 312 and impacts its performance. As a result, the TX buffer level shifter 314 is needed to isolate the CTLE 312 from the TX driver 316 and drive the long routing path from the CTLE 312 to the TX driver 316. The TX buffer level shifter 314 also provides the right DC level for TX driver input if its value is different from DC level of CTLE output.

A conventional way of implementing the CTLE buffer/level shifter 310 or the TX buffer/level shifter 314 is an active circuit which has wide bandwidth and shifts DC level to the desired value for the CTLE 312 or the TX driver 316. Considering multi-GHz speed of the CTLE 312 (e.g., 5-10-20 GHz), depending on the technology and application, a typical active buffer can consume milliampere range current (e.g., 10~20 mA), which is a considerable amount of current for low power applications. In accordance with an embodiment of the invention, a level shifter includes a transistor connected between an input terminal of the level shifter and an output terminal of the level shifter, a resistor connected between a first terminal of the transistor and one of the input terminal of the level shifter and the output terminal of the level shifter, a capacitor connected between the input terminal of the level shifter and the output terminal of the level shifter, a current source connected between the output terminal of the level shifter and a fixed voltage, and a resistor divider connected between the resistor and the output terminal of the level shifter. The transistor and the resistor can be used to form a low-frequency signal path for a low-frequency component of an input signal received at the input terminal of the level shifter, and the capacitor can be used to form a high-frequency signal path for a high-frequency component of the input signal received at the input terminal of the level shifter. By conducting the low-frequency component of an input signal and the high-frequency component of the input signal through a respective signal path, the power consumption of the level shifter is reduced and the efficiency of the level shifter is improved.

Figure 4:
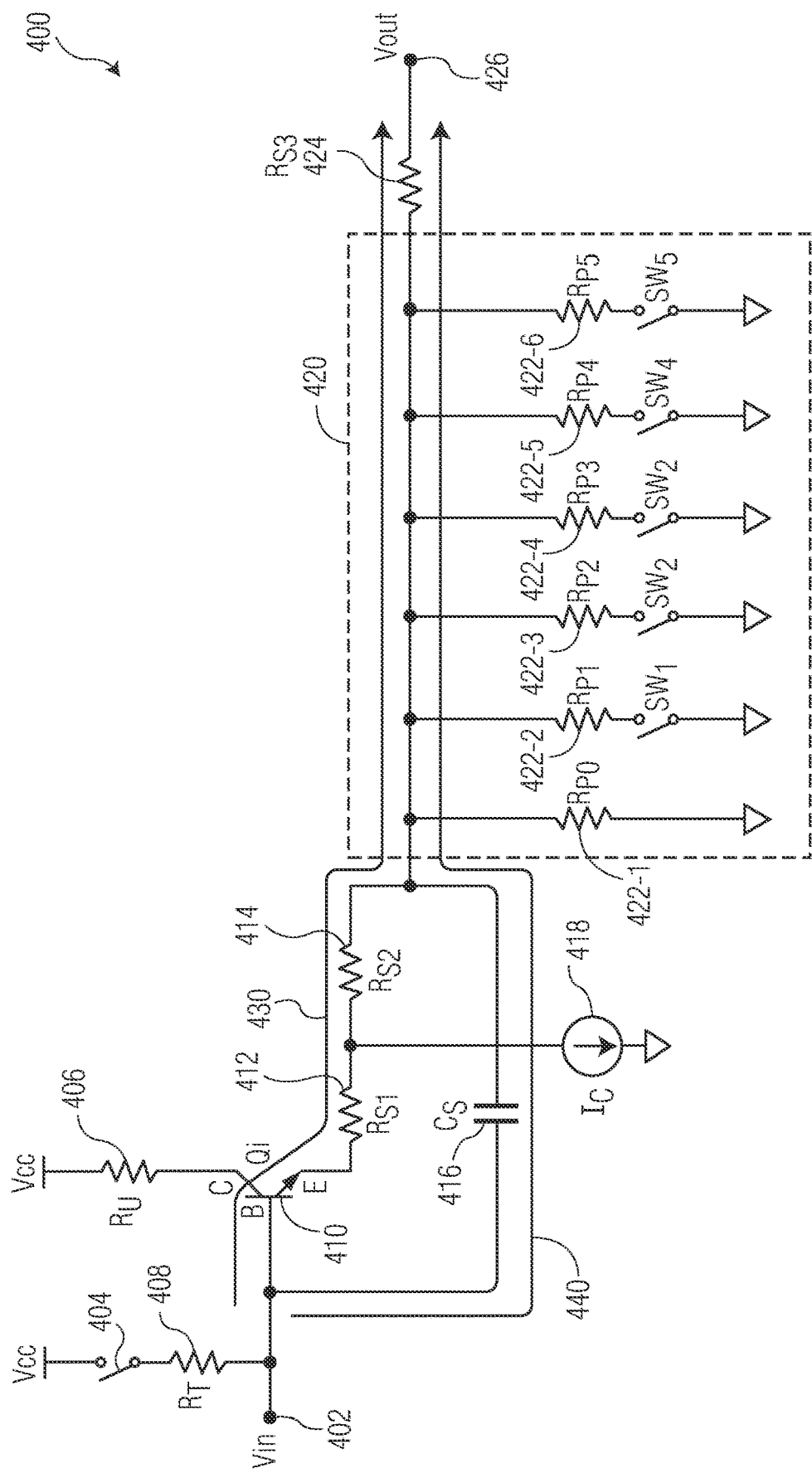
FIG. 4 depicts a wideband level shifter in accordance with an embodiment of the invention.

FIG. 4 depicts a wideband level shifter 400 in accordance with an embodiment of the invention. The wideband level shifter 400 can provide buffer with DC level shift function for a wide-band or narrow-band system. The level shifter 400 includes a resistive/low-frequency path 430 with DC level shifting for a low-frequency component of an incoming signal with an input voltage, $V_{IN}$, received through an input terminal/pin 402 of the level shifter 400 and a capacitive/high-frequency path 440 for a high-frequency component of the incoming signal. As shown in FIG. 4, the level shifter 400 includes a transistor 410, which can also be referred to as the transistor, "$Q_i$," to provide an extra DC level shift when the transistor 410 is biased with low current to pass the low-frequency portion of the incoming signal. The transistor 410 can be implemented using bipolar or complementary metal-oxide-semiconductor (CMOS) transistor technology. In an example, the transistor 410 is a bipolar junction transistor (BJT), which can be used as an emitter follower or a common collector amplifier. In another example, the transistor 410 is a metal-oxide-semiconductor field-effect transistor (MOSFET) (e.g., an N-channel MOSFET), which can be used as a source follower or a common drain amplifier. In addition, the level shifter 400 includes a capacitor 416, which is connected between a terminal of the transistor 410 and an output terminal/pin 426 of the level shifter 400 to pass the high-frequency component of the incoming signal (considering the resistor 424 is in the path). The level shifter 400 may use DC programming/shifting to set the required DC bias voltage of a next stage, which may be a linear CTLE, a TX driver, or any needed stage. In some embodiments, the level shifter 400 implements a resistor divider 420 with switchable resistors 422-1, 422-2, 422-3, 422-4, 422-5, 422-6 to provide a programmable DC loss or a programmable DC gain for, for example, a high-speed repeater. For example, with combination of a switched resistor bank, the level shifter 400 can provide DC gain programming and peaking gain boost, which can be used for trimming of DC/peaking gain of a CTLE. The level shifter 400 can also help overall high frequency gain boosting if needed because the level shifter 400 can act as a passive CTLE in which DC level shifting and isolation of the CTLE from input pins in wireline communication is needed for most applications. The level shifter 400 can also provide DC shift and isolation from a CTLE to a TX driver or a gain stage after a CTLE. Compared to a typical active buffer or level shifter, the level shifter 400 exhibits lower power consumption, which is suited for low power applications.

In the embodiment depicted in FIG. 4, the level shifter 400 is a high bandwidth (BW) level shifter in single-ended form. As shown in FIG. 4, the level shifter 400 includes the input terminal/pin 402, a switch 404 connected to a supply voltage, $V_{CC}$, a resistor 406 with a resistance value, $R_U$, connected to the supply voltage, $V_{CC}$, a resistor 408 with a resistance value, $R_T$, the transistor 410 connected between the input terminal/pin 402 and the output terminal/pin 426, a resistor 412 with a resistance value, $R_{S1}$, connected between a terminal of the transistor 410 and the output terminal/pin 426, an optional resistor 414 with a resistance value, $R_{S2}$, the capacitor 416 with a capacitance value, $C_s$, connected between a terminal of the transistor 410 and the output terminal/pin 426, a current source 418 connected between the resistor 412 and ground that provides current, $I_C$, the resistor divider 420 connected between the resistor 412 and the output terminal/pin 426 that includes resistors 422-1, 422-2, 422-3, 422-4, 422-5, 422-6 with resistance values $R_{P0}$, $R_{P1}$, $R_{P2}$, $R_{P3}$, $R_{P4}$, $R_{P5}$, and switches $SW_1$, $SW_2$, $SW_3$, $SW_4$, $SW_5$ connected to the ground, an optional resistor 424 with a resistance value, $R_{S3}$, and the output terminal/pin 426. In the embodiment depicted in FIG. 4, the transistor 410 and the resistor 412 are located in the low-frequency signal path 430 for a low-frequency component of an input signal received at the input terminal/pin 402 of the level shifter 400, and the capacitor 416 is located in the high-frequency signal path 440 for a high-frequency component of the input signal received at the input terminal 402 of the level shifter 400. When the transistor 410 is implemented as a bipolar junction transistor (BJT), the emitter terminal (E) of the BJT is connected to the resistor 412, the collector terminal (C) of the BJT is connected to the supply voltage, $V_{CC}$, through the resistor 406, and the base terminal (B) of the BJT is connected to the capacitor 416 and to the input terminal/pin 402. In the embodiment depicted in FIG. 4, the capacitor 416 is connected to the resistor 412 through the resistor 414 and to the output terminal/pin 426 of the level shifter 400 through the resistor 424, and the current source 418 is connected to the resistor 412 and to the resistor 414. The level shifter 400 is not limited to CMOS or Bipolar technology. For example, the transistor 410 may be implemented as an MOS transistor, a bipolar junction transistor, or other type of transistor. In some embodiments, the switches $SW_0$-$SW_5$ are PMOS, NMOS, or PMOS+NMOS transistors, which act as switches. Although the level shifter 400 is shown in FIG. 4 as including certain circuit elements, in other embodiments, the level shifter 400 may include one or more additional circuit elements. For example, the resistor divider 420 may include more than or less than six resistors. In another example, the resistor divider 420 may include more than or less than five switches. In another example, the resistor 434 may be optional. In another example, the level shifter 400 includes matching circuits for the current source 418. The level shifter 400 can be used in various applications, such as audio applications, automotive applications, communications applications, and/or consumer or appliance applications. The level shifter 400 can be implemented in at least one substrate, such as at least one semiconductor wafer. In an embodiment, the level shifter 400 or a component of the level shifter 400 is packaged as a stand-alone integrated circuit (IC) chip. In some embodiments, the level shifter 400 is included in a wired circuit. In some embodiments, the level shifter 400 is included in a wireless circuit.

In the level shifter 400 depicted in FIG. 4, changing the current, $I_C$, provided by the current source 418 can change the desire DC level, $V_{OUT}$, at the output terminal/pin 426 of the level shifter 400. For example, considering $R_{S3}$ being equal to 0Ω and $R_{P0}$ being very large and the switches $SW_1$, $SW_2$, $SW_3$, $SW_4$, $SW_5$ open (i.e., not conductive), the output voltage, $V_{OUT}$, at the output terminal/pin 426 can be approximately expressed as:

$$V_{OUT} = V_{IN} - 0.7 \times R_{S1} \times I_C, \quad (1)$$

where $V_{IN}$ is the input voltage at the input terminal/pin 402. When the transistor 410 is implemented as a BJT, the low-frequency signal path 430 exists through the base terminal, B, the emitter terminal, E, of the transistor 410 and the resistors 412, 414, 424. The resistor 414 may be optional (i.e., $R_{S2}$ can be 0Ω), and the resistor 424 may be optional (i.e., $R_{S3}$ can be 0Ω). However, a small resistance value of $R_{S3}$ of the resistor 424 can provide secondary electrostatic discharge (ESD) protection for a device to which the output voltage, $V_{OUT}$, is applied. The high-frequency signal path 440 exists through the capacitor 416 and the resistor 424, which may be optional (i.e., $R_{S3}$ can be 0Ω). The high-frequency signal path 440 bypasses the transistor 410 for high-frequency components of the incoming signal through the input terminal/pin 402, which makes the level shifter 400 a high-frequency circuit. In addition, when the transistor 410 is implemented as a BJT, connecting the capacitor 416 to the base terminal, B, of the transistor 410, makes the transistor 410 a low-speed part of the level shifter 400, which means a small bias current ($I_C$) can provide the needed biasing for the transistor 410. The switchable resistors 422-2, 422-3, 422-4, 422-5, 422-6 with the switches, $SW_1$, $SW_2$, $SW_3$, $SW_4$, $SW_5$, in parallel with the resistor 422-1 form the resistor divider 420. For example, $R_{P0}/(R_{P0}+R_{S1}+R_{S2})$ may be −4B, and the switchable resistors 422-2, 422-3, 422-4, 422-5, 422-6 can provide 5 more divide ratio, e.g., losses of −5 dB, −6 dB, −7 dB, −8 dB, −9 dB, which is equal to −6 dB+(−3 dB, −2 dB, −1 dB, 0 dB, 1 dB, 2 dB), which means the level shifter 400 can provide a programmable gain and can be considered as a programmable gain amplifier (PGA) in front of a CTLE. Because the output impedance of the current source 418 can be high, programmable DC level by changing the current, $I_C$, can be independent of the achieved programmable gain. The resistance value, $R_U$, of the resistor 406 can be 0Ω or a selected value to set the right biasing condition for the transistor 410.

Figure 5:
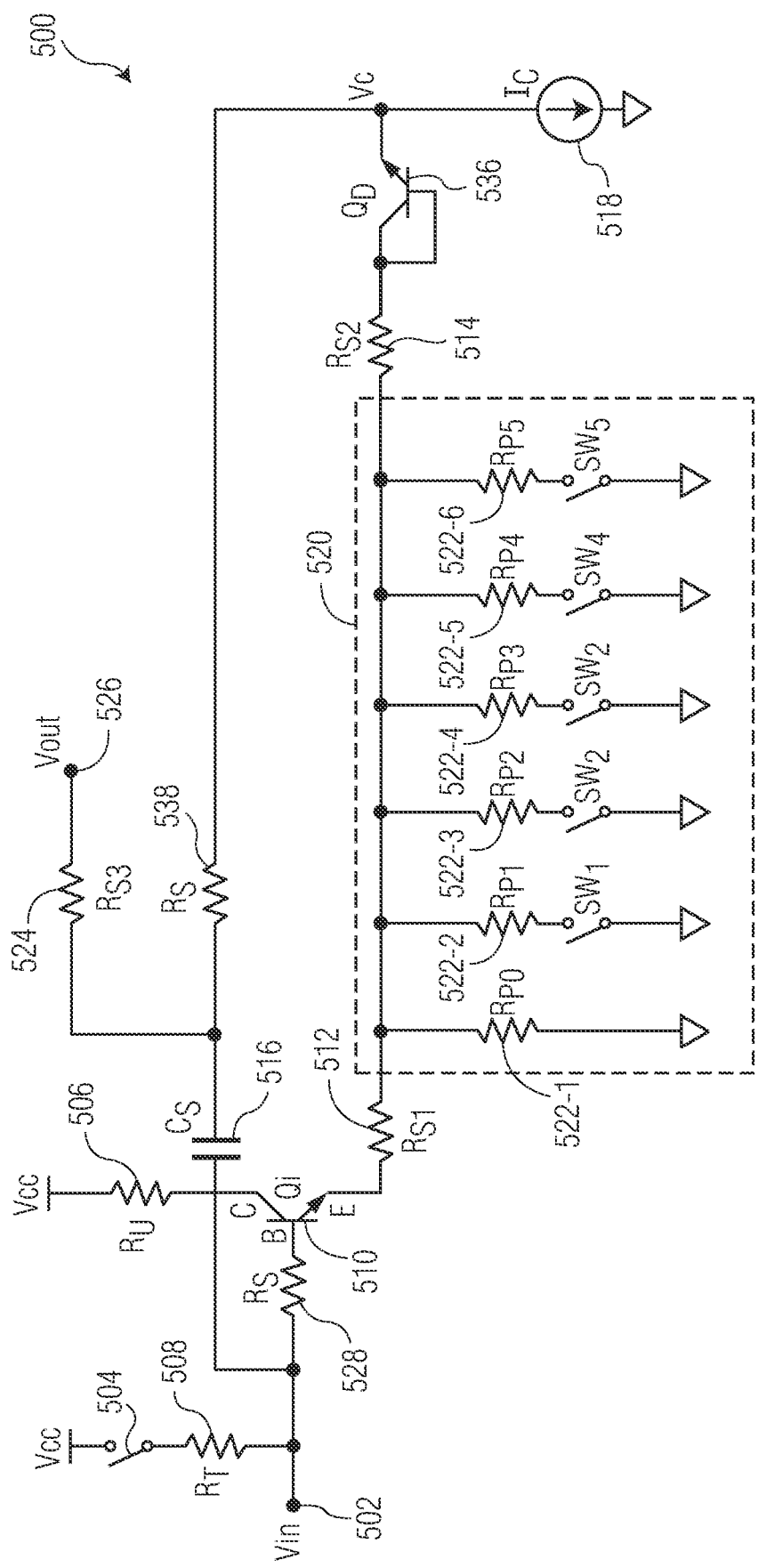
FIG. 5 is a schematic block diagram of a wideband level shifter in accordance with an embodiment of the invention.

FIG. 5 is a schematic block diagram of a wideband level shifter 500 in accordance with an embodiment of the invention. The wideband level shifter 500 depicted in FIG. 5 is an embodiment of the wideband level shifter 400 depicted in FIG. 4. However, the wideband level shifter 400 depicted in FIG. 4 is not limited to the embodiment shown in FIG. 5. In the embodiment depicted in FIG. 5, the level shifter 500 is a high-BW level shifter in single-ended form. As shown in FIG. 5, the level shifter 500 includes an input terminal/pin 502 from which an input signal with a voltage, $V_{IN}$, is received, a switch 504 connected to a supply voltage, $V_{CC}$, a resistor 506 with a resistance value, $R_U$, connected to the supply voltage, $V_{CC}$, a resistor 508 with a resistance value, $R_T$, a transistor 510, which can also be referred to as the transistor, $Q_t$, connected between the input terminal/pin 502 and the output terminal/pin 526, a resistor 512 with a resistance value, $R_{S1}$, connected between a terminal of the transistor 510 and the output terminal/pin 526, an optional resistor 514 with a resistance value, $R_{S2}$, a capacitor 516 with a capacitance value, Cs, connected between a terminal of the transistor 510 and the output terminal/pin 526, a current source 518 connected between the resistor 512 and ground that provides current, $I_C$, a resistor divider 520 connected between the resistor 512 and the output terminal/pin 526 that includes resistors 522-1, 522-2, 522-3, 522-4, 522-5, 522-6 with resistance values, $R_{P0}$, $R_{P1}$, $R_{P2}$, $R_{P3}$, $R_{P4}$, $R_{P5}$, and switches, $SW_1$, $SW_2$, $SW_3$, $SW_4$, $SW_5$ connected to the ground, a resistor 524 with a resistance value, $R_{S3}$, resistors 528, 538 with a resistance value, $R_S$, for the secondary ESD protection of the transistor 510, a transistor 536, which can also be referred to as the transistor, $Q_D$, and an output terminal/pin 526 from which an output signal with a voltage, $V_{OUT}$, is outputted. In the embodiment depicted in FIG. 5, the transistor 510 and the resistor 512 are located in a low-frequency signal path for a low-frequency component of an input signal received at the input terminal 502 of the level shifter 500, and the capacitor 516 is located in a high-frequency signal path for a high-frequency component of the input signal received at the input terminal 502 of the level shifter 500. When the transistor 510 is implemented as a bipolar junction transistor (BJT), the emitter terminal (E) of the BJT is connected to the resistor 512, the collector terminal (C) of the BJT is connected to the supply voltage, $V_{CC}$, through the resistor 506, and the base terminal (B) of the BJT is connected to the capacitor 416 and to the input terminal/pin 402 through the resistor 528. In the embodiment depicted in FIG. 5, the transistor 536 is connected to the current source 518 and to the resistor divider 520 through the resistor 514, the capacitor 516 is connected to the output terminal/pin 526 of the level shifter 500 through the resistor 524 and to a terminal of the transistor 510 (e.g., a base terminal of a BJT) through the resistor 528, and the current source 518 is connected to the resistor 524 and the capacitor 516 through the resistor 538. The level shifter 500 is not limited to CMOS or Bipolar technology. For example, the transistors 510, 536 may be implemented as MOS transistors, bipolar junction transistors, or other type of transistors. In some embodiments, the switches $SW_0$-$SW_5$ are PMOS, NMOS, or PMOS+NMOS transistors, which act as switches. Although the level shifter 500 is shown in FIG. 5 as including certain circuit elements, in other embodiments, the level shifter 500 may include one or more additional circuit elements. For example, the resistor divider 520 may include more than or less than six resistors. In another example, the resistor divider 520 may include more than or less than five switches. In another example, the resistor 534 may be optional. In another example, the level shifter 500 includes matching circuits for the current source 518. In some embodiments, the level shifter 500 is included in a wired circuit. In some embodiments, the level shifter 500 is included in a wireless circuit.

In the level shifter 500 depicted in FIG. 5, changing the current, $I_C$, provided by the current source 518 can change the desire DC level, $V_{OUT}$, at the output terminal/pin 526 of the level shifter 500. For example, considering $R_{S1}$, $R_{S2}$ being equal to 1 kΩ, and $I_C$ being equal to 0.3 mA, and $R_0$ being very large, the output voltage, $V_{OUT}$, at the output terminal/pin 526 can be approximately expressed as:

$$V_{OUT}=V_{IN}-0.7V-(R_{S1}+R_{S2})\times I_C-0.7V, \tag{2}$$

$$=V_{IN}-0.7V-2\times 0.3V-0.7V, \tag{3}$$

$$=V_{IN}-2V. \tag{4}$$

where $V_{IN}$ is the input voltage at the input terminal/pin 402. For the terminated to supply case, when the output voltage, $V_{OUT}$, is 3.3V, the input voltage, $V_{IN}$, is 1.3V. The above resistance values and the current value are some examples. However, the resistance values and the current value are not limited to the above examples. The transistor 536, which is a diode connected transistor, can be used to reduce need of extra current, $I_C$. In some embodiments, the transistor 536 can be removed or omitted from the level shifter 500 (e.g., when the input voltage, $V_{IN}$, is 2V). The resistance value, $R_{S2}$, of the resistor 514 and/or the current, $I_C$, provided by the current source 518 can be adjusted for a desired output voltage, $V_{OUT}$, at the output terminal/pin 526. When $R_{P0}$ is equal to 2 kΩ, $R_{P1}$ is equal to 5 kΩ, $R_{P2}$ is equal to 5 kΩ, $R_{P3}$ is equal to 4 kΩ, $R_{P4}$ is equal to 3 kΩ, $R_{P5}$ is equal to 3 kΩ, a DC gain of −6 dB+(−3 dB, −2 dB, −1 dB, 0 dB, 1 dB, 2 dB) can be achievable. In some embodiments, $R_S$ is around 1 k0 and $C_S$ is around 0.25 pF. The zero frequency, fz, of the AC response of the level shifter 500 can be adjusted (e.g., mid-band 100M~1 GHz) by changing $C_S$ if needed.

Figure 6:
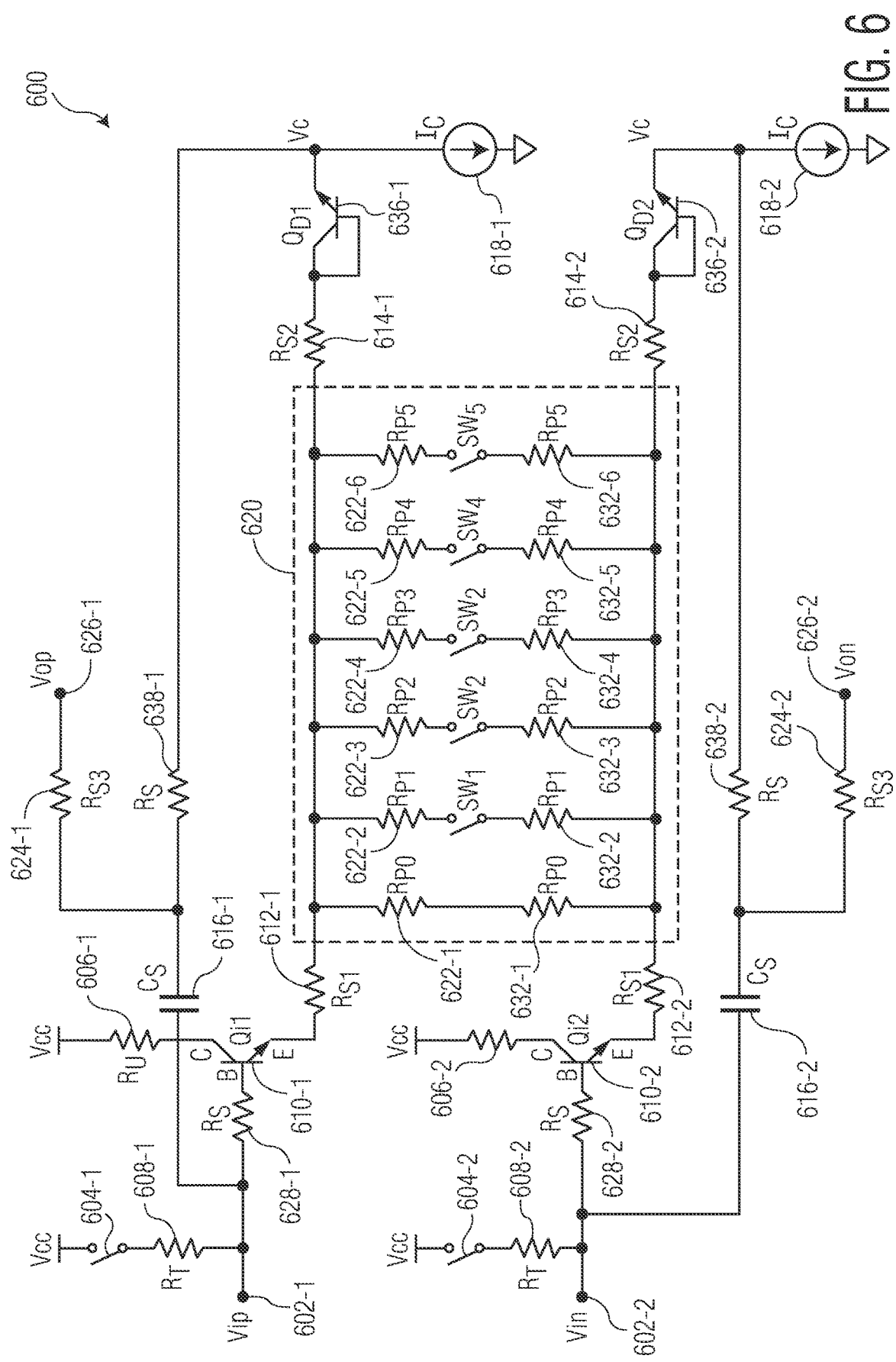
FIG. 6 is a schematic block diagram of a high-to-low level shifter in accordance with an embodiment of the invention.

FIG. 6 is a schematic block diagram of a high-to-low level shifter 600 in accordance with an embodiment of the invention. In the embodiment depicted in FIG. 6, the level shifter 600 is a high-BW fully differential level shifter. As shown in FIG. 6, the level shifter 600 includes input terminals/pins 602-1, 602-2 from which a differential input signal with voltages, $V_{IP}$, $V_{IN}$, is received, switches 604-1, 604-2 connected to a supply voltage, $V_{CC}$, resistors 606-1, 606-2 with a resistance value, $R_L$, connected to the supply voltage, $V_{CC}$, resistors 608-1, 608-2 with a resistance value, $R_T$, transistors 610-1, 610-2, which can also be referred to as the transistors, $Q_{i1}$, $Q_{i2}$, connected between the input terminals/pins 602-1, 602-2 and output terminals/pins 626-1, 626-2, a resistor 612-1 with a resistance value, $R_{S1}$, connected between a terminal of the transistor 610-1 and the output terminal/pin 626-1, a resistor 612-2 with a resistance value, $R_{S1}$, connected between a terminal of the transistor 610-2 and the output terminal/pin 626-2, optional resistors 614-1, 614-2 with a resistance value, $R_{s2}$, a capacitor 616-1 with a capacitance value, Cs, connected between a terminal of the transistor 610-1 and the output terminal/pin 626-1, a capacitor 616-2 with a capacitance value, Cs, connected between a terminal of the transistor 610-2 and the output terminal/pin 626-2, a current source 618-1 connected between the resistor 612-1 and ground that provides current, $I_C$, a current source 618-2 connected between the resistor 612-2 and ground that provides current, $I_C$, a resistor divider 620 connected between the resistor 612-1 and the resistor 612-2 that includes a first set of resistors 622-1, 622-2, 622-3, 622-4, 622-5, 622-6 with resistance values, $R_{P0}$, $R_{P1}$, $R_{P2}$, $R_{P3}$, $R_{P4}$, $R_{P5}$, a second set of resistors 632-1, 632-2, 632-3, 632-4, 632-5, 632-6 with resistance values, $R_{P0}$, $R_{P1}$, $R_{P2}$, $R_{P3}$, $R_{P4}$, $R_{P5}$, and switches, $SW_1$, $SW_2$, $SW_3$, $SW_4$, $SW_5$ connected to the ground, resistors 624-1, 624-2 with a resistance value, $R_{S3}$, resistors 628-1, 628-2, 638-1, 638-2 with a resistance value, $R_S$, for the secondary ESD protection of the transistors 610-1, 610-2, transistors 636-1, 636-2, which can also be referred to as the transistors, $Q_{D1}$, $Q_{D2}$, and output terminal/pins 626-1, 626-2 from which a differential output signal with voltages, $V_{OP}$, $V_{ON}$, is outputted. In the embodiment depicted in FIG. 6, the transistor 610-1 and the resistor 612-1 are located in a low-frequency signal path for a low-frequency component of an input signal received at the input terminal 602-1 of the level shifter 600, and the capacitor 616-1 is located in a high-frequency signal path for a high-frequency component of the input signal received at the input terminal 602-1 of the level shifter 600, while the transistor 610-2 and the resistor 612-2 are located in a low-frequency signal path for a low-frequency component of an input signal received at the input terminal 602-2 of the level shifter 600, and the capacitor 616-2 is located in a high-frequency signal path for a high-frequency component of the input signal received at the input terminal 602-2 of the level shifter 600. When the transistor 610-1 is implemented as a bipolar junction transistor (BJT), the emitter terminal (E) of the BJT is connected to the resistor 612-1, the collector terminal (C) of the BJT is connected to the supply voltage, $V_{CC}$, through the resistor 606-1, and the base terminal (B) of the BJT is connected to the capacitor 616-1 and to the input terminal/pin 602-1 through the resistor 628-1. When the transistor 610-2 is implemented as a bipolar junction transistor (BJT), the emitter terminal (E) of the BJT is connected to the resistor 612-2, the collector terminal (C) of the BJT is connected to the supply voltage, $V_{CC}$, through the resistor 606-2, and the base terminal (B) of the BJT is connected to the capacitor 616-2 and to the input terminal/pin 602-2 through the resistor 628-2. In the embodiment depicted in FIG. 6, the transistor 636-1 is connected to the current source 618-1 and to the resistor divider 620 through the resistor 614-1, the capacitor 616-1 is connected to the output terminal/pin 626-1 of the level shifter 600 through the resistor 624-1 and to a terminal of the transistor 610-1 (e.g., a base terminal of a BJT) through the resistor 628-1, and the current source 618-1 is connected to the resistor 624-1 and the capacitor 616-1 through the resistor 638-1. In the embodiment depicted in FIG. 6, the transistor 636-2 is connected to the current source 618-2 and to the resistor divider 620 through the resistor 614-2, the capacitor 616-2 is connected to the output terminal/pin 626-2 of the level shifter 600 through the resistor 624-2 and to a terminal of the transistor 610-2 (e.g., a base terminal of a BJT) through the resistor 628-2, and the current source 618-2 is connected to the resistor 624-2 and the capacitor 616-2 through the resistor 638-2. The level shifter 600 is not limited to CMOS or Bipolar technology. For example, the transistors 610-1, 610-2, 636-1, 636-2 may be implemented as MOS transistors, bipolar junction transistors, or other type of transistors. In some embodiments, the switches $SW_0$-$SW_5$ are PMOS, NMOS, or PMOS+NMOS transistors, which act as switches. Although the level shifter 600 is shown in FIG. 6 as including certain circuit elements, in other embodiments, the level shifter 600 may include one or more additional circuit elements. For example, the resistor divider 620 may include more than or less than twelve resistors. In another example, the resistor divider 620 may include more than or less than five switches. In another example, the resistors 624-1, 624-2 may be optional. In another example, the level shifter 600 includes matching circuits for the current sources 618-1, 618-2. In some embodiments, the level shifter 600 is included in a wired circuit. In some embodiments, the level shifter 600 is included in a wireless circuit.

Figure 7:
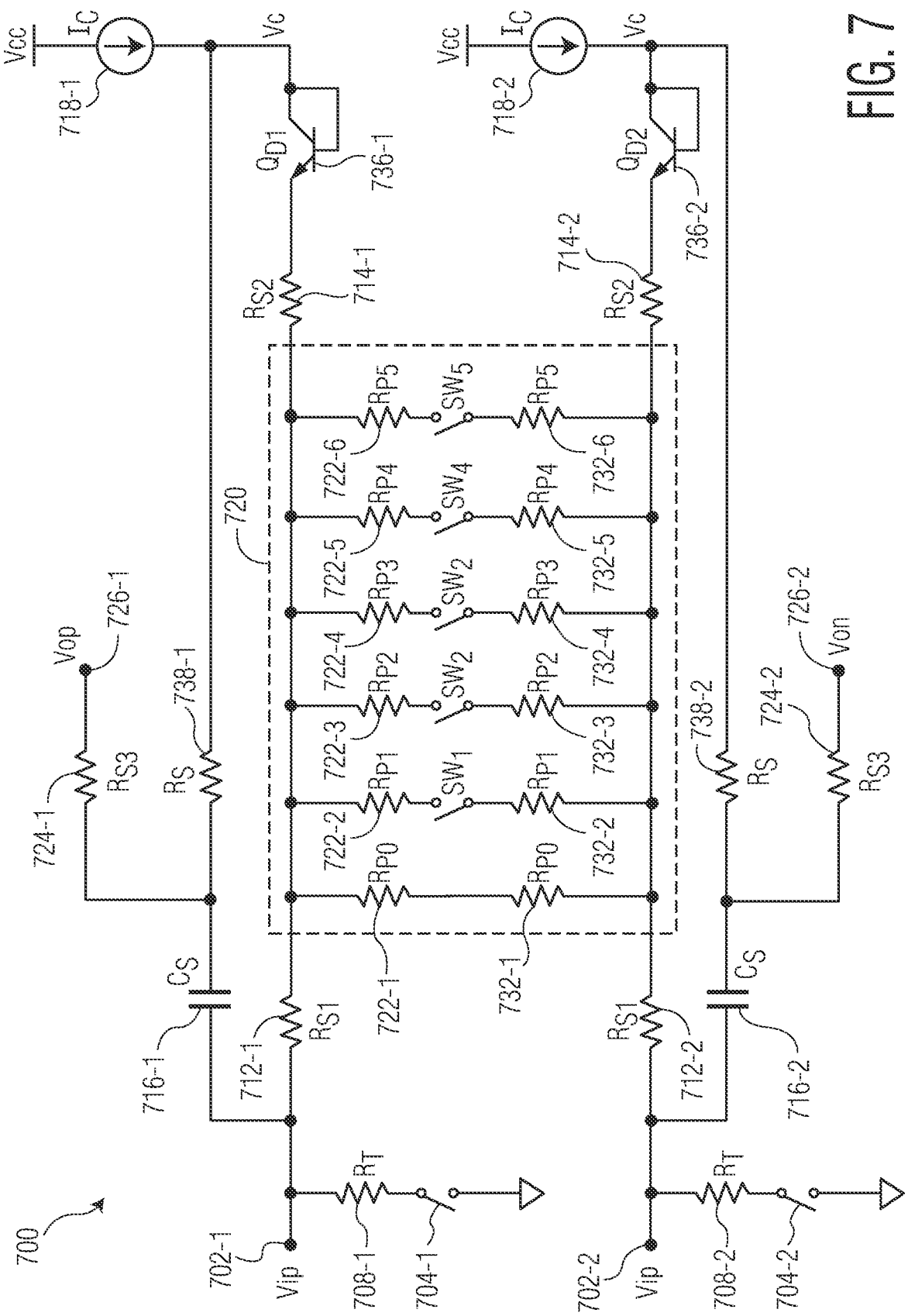
FIG. 7 is a schematic block diagram of a low-to-high level shifter in accordance with an embodiment of the invention.

FIG. 7 is a schematic block diagram of a low-to-high level shifter 700 in accordance with an embodiment of the invention. In the embodiment depicted in FIG. 7, the level shifter 700 is a high-BW fully differential level shifter in which input resistors 708-1, 708-2 are terminated to ground through switches 704-1, 704-2. As shown in FIG. 7, the level shifter 700 includes input terminals/pins 702-1, 702-2 from which a differential input signal with voltages, $V_{IP}$, $V_{IN}$, is received, the switches 704-1, 704-2, the input resistors 708-1, 708-2 with a resistance value, $R_T$, resistors 712-1, 712-2 with a resistance value, $R_{S1}$, optional resistors 714-1, 714-2 with a resistance value, $R_{S2}$, capacitors 716-1, 716-2 with a capacitance value, Cs, current sources 718-1, 718-2 that provides current, $I_C$, a resistor divider 720 that includes a first set of resistors 722-1, 722-2, 722-3, 722-4, 722-5, 722-6 with resistance values, $R_{P0}$, $R_{P1}$, $R_{P2}$, $R_{P3}$, $R_{P4}$, $R_{P5}$, a second set of resistors 732-1, 732-2, 732-3, 732-4, 732-5, 732-6 with resistance values, $R_{P0}$, $R_{P1}$, $R_{P2}$, $R_{P3}$, $R_{P4}$, $R_{P5}$, and switches, $SW_1$, $SW_2$, $SW_3$, $SW_4$, $SW_5$, resistors 724-1, 624-2 with a resistance value, $R_{S3}$, resistors 738-1, 738-2 with a resistance value, $R_{S3}$, transistors 736-1, 736-2, which can also be referred to as the transistors, $Q_{D1}$, $Q_{D2}$, and output terminal/pins 726-1, 726-2 from which a differential output signal with voltages, $V_{OP}$, $V_{ON}$, is outputted. In the embodiment depicted in FIG. 7, the transistor 736-1 and the resistor 712-1 are located in a low-frequency signal path for a low-frequency component of an input signal received at the input terminal 702-1 of the level shifter 700, and the capacitor 716-1 is located in a high-frequency signal path for a high-frequency component of the input signal received at the input terminal 702-1 of the level shifter 700, while the transistor 736-2 and the resistor 712-2 are located in a low-frequency signal path for a low-frequency component of an input signal received at the input terminal 702-2 of the level shifter 700, and the capacitor 716-2 is located in a high-frequency signal path for a high-frequency component of the input signal received at the input terminal 702-2 of the level shifter 700. Compared to the current sources 618-1, 618-2 of the level shifter 600 depicted in FIG. 6 that are terminated to the ground, the current sources 718-1, 718-2 of the level shifter 700 depicted in FIG. 7 are located in the opposite direction and inject DC current to the input resistors 708-1, 708-2 (i.e., the current sources 718-1, 718-2 are connected to supply voltage, $V_{CC}$). Consequently, the level shifter 700 can provide a DC level shift up. In addition, although the input resistors 708-1, 708-2 are shown in FIG. 7 as terminated to the ground through the switches 704-1, 704-2, in other embodiments, the input resistors 708-1, 708-2 can be terminated to any voltage to make the DC level shift to a higher or lower voltage. The level shifter 700 is not limited to CMOS or Bipolar technology. For example, the transistors 736-1, 736-2 may be implemented as MOS transistors, bipolar junction transistors, or other type of transistors. In some embodiments, the switches $SW_0$-$SW_5$ are PMOS, NMOS, or PMOS+NMOS transistors, which act as switches. Although the level shifter 700 is shown in FIG. 7 as including certain circuit elements, in other embodiments, the level shifter 700 may include one or more additional circuit elements. For example, the resistor divider 720 may include more than or less than twelve resistors. In another example, the resistor divider 720 may include more than or less than five switches. In another example, the resistors 724-1, 724-2 may be optional. In another example, the level shifter 700 includes matching circuits for the current sources 718-1, 718-2. In some embodiments, the level shifter 700 is included in a wired circuit. In some embodiments, the level shifter 700 is included in a wireless circuit.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A level shifter comprising:
a transistor connected between an input terminal of the level shifter and an output terminal of the level shifter;
a first resistor connected between a first terminal of the transistor and the output terminal of the level shifter;
a capacitor connected between the input terminal of the level shifter and the output terminal of the level shifter;
a current source connected between the output terminal of the level shifter and a fixed voltage; and
a resistor divider connected between the first resistor and the output terminal of the level shifter.

2. The level shifter of claim 1,
wherein the transistor and the first resistor are located in a first signal path for a low-frequency component of an input signal received at the input terminal of the level shifter, and
wherein the capacitor is located in a second signal path for a high-frequency component of the input signal received at the input terminal of the level shifter.

3. The level shifter of claim 1,
wherein the resistor divider comprises a plurality of resistors and a plurality of switches connected to the resistors.

4. The level shifter of claim 1,
wherein the transistor comprises a source follower or an emitter follower.

5. The level shifter of claim 1,
wherein the level shifter is a single-ended level shifter.

6. The level shifter of claim 1,
wherein the level shifter is a differential level shifter.

7. A level shifter comprising:
a transistor connected between an input terminal of the level shifter and an output terminal of the level shifter;
a first resistor connected between a first terminal of the transistor and the output terminal of the level shifter;
a capacitor connected between a second terminal of the transistor and the output terminal of the level shifter, wherein the capacitor is connected to the input terminal of the level shifter;
a current source connected between the first resistor and ground; and
a resistor divider connected between the first resistor and the output terminal of the level shifter,
wherein the transistor and the first resistor are located in a first signal path for a low-frequency component of an input signal received at the input terminal of the level shifter, and
wherein the capacitor is located in a second signal path for a high-frequency component of the input signal received at the input terminal of the level shifter.

8. The level shifter of claim 7,
wherein the resistor divider comprises a plurality of resistors and a plurality of switches connected to the resistors and ground.

9. The level shifter of claim 7,
wherein the transistor comprises a bipolar junction transistor (BJT),
wherein the first terminal of the transistor comprises an emitter terminal of the BJT, and
wherein the second terminal of the transistor comprises a base terminal of the BJT.

10. The level shifter of claim 9,
wherein a collector terminal of the BJT is connected to a supply voltage through a second resistor.

11. The level shifter of claim 7,
wherein the capacitor is connected to the first resistor through a second resistor and to the output terminal of the level shifter through a third resistor.

12. The level shifter of claim 11,
wherein the current source is connected to the first resistor and to the second resistor.

13. The level shifter of claim 7, further comprising
a second transistor coupled at one end to the current source and coupled at another end to the resistor divider through a second resistor.

14. The level shifter of claim 13,
wherein the capacitor is connected to the output terminal of the level shifter through a third resistor and to the second terminal of the transistor through a fourth resistor.

15. The level shifter of claim 14,
wherein the current source is connected to the second resistor and the capacitor through a fifth resistor.

16. The level shifter of claim 7, further comprising
a second resistor connected to the input terminal of the level shifter and a switch connected to the second resistor and to a supply voltage.

17. The level shifter of claim 7,
wherein the level shifter is a single-ended level shifter.

18. A differential level shifter comprising:
a first transistor connected between a first input terminal of the differential level shifter and a first output terminal of the differential level shifter;
a first resistor connected between a first terminal of the first transistor and the first output terminal of the differential level shifter;
a first capacitor connected between a second terminal of the first transistor and the first output terminal of the differential level shifter, wherein the first capacitor is connected to the first input terminal of the differential level shifter;
a first current source connected between the first resistor and ground;
a second transistor connected between a second input terminal of the differential level shifter and a second output terminal of the differential level shifter;
a second resistor connected between a first terminal of the second transistor and the second output terminal of the differential level shifter;
a second capacitor connected between a second terminal of the second transistor and the second output terminal of the differential level shifter, wherein the second capacitor is connected to the second input terminal of the differential level shifter;
a second current source connected between the second resistor and ground; and
a resistor divider connected between the first resistor and the second resistor.

19. The differential level shifter of claim 18,
wherein the resistor divider comprises a plurality of resistors and a plurality of switches connected to the plurality of resistors and ground.

20. The differential level shifter of claim 18,
wherein the first transistor comprises a bipolar junction transistor (BJT),
wherein the first terminal of the first transistor comprises an emitter terminal of the BJT, and
wherein the second terminal of the first transistor comprises a base terminal of the BJT.

* * * * *